United States Patent [19]  
Lewis

[11] Patent Number: 4,639,690  
[45] Date of Patent: Jan. 27, 1987

[54] TUNABLE, DIELECTRIC-RESONATOR-STABILIZED OSCILLATOR AND METHOD OF TUNING SAME

[75] Inventor: Gary K. Lewis, Upper Marlboro, Md.

[73] Assignee: Litton Systems, Inc.

[21] Appl. No.: 752,297

[22] Filed: Jul. 5, 1985

[51] Int. Cl.[4] .......................... H03B 5/18; H01P 7/10
[52] U.S. Cl. .............................. 331/96; 331/107 DP; 331/117 D; 333/231; 333/235
[58] Field of Search ...................... 331/96, 99, 107 SL, 331/107 DP, 117 D, 117 FE; 333/219, 227, 231, 235; 310/312

[56] References Cited

U.S. PATENT DOCUMENTS 4,484,156 11/1984 Khanna et al. .................... 331/96 X
4,562,370 12/1985 Von Dach .......................... 310/312

FOREIGN PATENT DOCUMENTS 58-204602 11/1983 Japan ................................. 333/219

OTHER PUBLICATIONS

Golio, J. M., "New Approach for FET Oscillator Design", Microwave Journal, Oct. 1978, pp. 59–61.
Wagner, W., "Oscillator Design by Device Line Measurement", Microwave Journal, Feb. 1979, pp. 43–48.
Hamilton, S., "Microwave Oscillator Circuits", Microwave Journal, Apr. 1978, pp. 63–66, 83.
Hiroyuki, A., et al, "A Highly-Stabilized Low-Noise GaAs FET . . . ", IEEE Trans., vol. MTT-26, No. 3, Mar. 1978, pp. 156–162.

Primary Examiner—Siegfried H. Grimm

[57] ABSTRACT

A dielectric-resonator-stabilized, Gallium-Arsenide-FET, negative resistance oscillator operating in the microwave region incorporating an improved form of dielectric resonator whose resonant frequency is tuned by the addition or removal of metal from the surface of a dielectric tuning plate in the resonator, and a method for tuning the oscillator to the desired frequency range with the resonator in place by use of a laser-trimming device are disclosed.

17 Claims, 8 Drawing Figures

TUNABLE, DIELECTRIC-RESONATOR-STABILIZED OSCILLATOR AND METHOD OF TUNING SAME

BACKGROUND OF THE INVENTION

1. Field of the Invention

This invention relates, in general, to frequencystabilizer oscillators, more particularly, to dielectricresonator-stabilized oscillators (DRSO's), and most specifically, to an improved form of a dielectric resonator (DR) to be used in conjunction with a GalliumArsenide (GaAs) Field Effect Transistor (FET) oscillator operating in the microwave region which interconnects in a tuned circuit to the DR by means of a transmission line in the form of a slab-type microstripline, as well as a method for tuning the same to a precise, desired frequency on a production basis by the use of a trimming device such as a laser-trimmer.

2. Summary of the Prior Art

Electrical oscillators are used widely in the electronics industry for a variety of purposes. Oscillators operating within the microwave region have come to be commonly utilized in the fields of radar and telecommunications, in which the oscillators are employed as sub-components in circuits having timing or distance-measuring functions, for example.

It is well known in the art that a negative resistance oscillator can be created by adding the proper choice of terminating impedance to an unstable, active element.

At frequencies in the microwave region, it is common to employ a GaAs FET as the active element of the oscillator circuit in order to take advantage of the inherent instability of these devices. Typical of oscillator circuits incorporating these kinds of devices as an active element are those illustrated in FIGS. 2, 3, and 4 in which the configurations illustrated are for a common drain, a common source and a common gate oscillator circuit, respectively.

An additional requirement placed upon oscillators, particularly those operating in timing and measuring applications, is that of frequency stability. It is well known in the art that, in a given oscillator circuit of the type described above, the resonant frequency of the circuit will be subject to both long-term and short-term variations, due primarily to variations in electrical parameters of the elements of the circuit with time, temperature, etc., as well as the random effect of stray signals coupled into the circuit. For this reason, it is not uncommon to incorporate into the oscillator circuit a resonant device which is used to determine the frequency at which the circuit will oscillate. Moreover, it is known that, if the elements of the resonator device are selected such that they introduce a large variation of phase with frequency, then the oscillator frequency will tend to depend more completely only upon the properties of the resonator itself and will become nearly independent of all other variations in circuit parameters. Thus, a tuned-circuit oscillator can be made to have excellent frequency stability, provided that the Q of the resonator is sufficiently high and that the reactances in the resonator are relatively stable.

A well known, analogous tuned-circuit feedback oscillator which has widespread use in the industry is that which incorporates a piezo-electric crystal, usually quartz, in which the electro-mechanical system formed thereby provides oscillators having resonant frequencies ranging from a few kilohertz to a few megahertz which are extremely stable with respect to time and temperature.

In the 1-20 GHz region, a different mechanization is called for, and it is not uncommon to employ a resonator having a resonant cavity filled with a dielectric material electrically coupled into a negative resistance oscillator circuit. Typically, this dielectric material is air, but evacuated resonant cavities have also been employed. One objection presented by these tuned cavities is their size, in that the dielectric constant of a vacuum or air is relatively low, necessitating a larger cavity to achieve the appropriate reactance of the resonator. Recently, due primarily to the development of dielectric materials whose physical properties and stability with time and temperatures can be more precisely controlled, it has become possible to implement a tuned-circuit oscillator which employs a resonant cavity containing a resonator body of dielectric material which, when coupled effectively into the oscillator circuit, is capable of producing frequency stabilities on the order of 5 ppm/°C. in that frequency range with resonators having significantly smaller dimensions. To couple the DR into the oscillator circuit, a transmission line technique may be employed. An additional degree of stability can be achieved (to 1ppm/°C.) by the incorporation of a second DR circuit in the output leg of the oscillator.

The initial resonant frequency of the circuit is achieved by careful control of the dimensions and materials of the DR and its initial placement along the transmission line to achieve the proper phase relationship with respect to the output of the active circuit. The oscillator is then finely-tuned by the means of minute adjustments of the dimensions of the DR cavity.

Typically, this fine-tuning is accomplished by providing the DR cavity with a movable wall, i.e., a wall comprising a threaded tuning screw which is adjusted upward or downward to adjust the dimensions of the resonating cavity. Obviously, the mating threads between the tuning screw and the walls of the DR cavity must be precisely formed, finely pitched and have little or no effective backlash in order to permit precision tuning of the device. Moreover, a mechanism for fixing the tuning screw in position, once the desired frequency has been achieved, and without affecting the frequency previously tuned, must be incorporated. Typically, this is accomplished by means of a locking nut or by careful bonding of the tuning screw in place.

SUMMARY OF THE INVENTION

It is therefore an object of the present invention to provide a Dielectric-Resonator-Stabilized Oscillator incorporating a GaAs FET operating in the frequency range of 1-20 GHz which is finely-tunable to a tolerance of 1-5 ppm/°C. by means of a Dielectric Resonator which eliminates any need for a threaded, movable part within the circuit and which will permit the output frequency of the oscillator to be finely-tuned to the degree of precision desired in a reliable and permanent manner.

It is a further object of this invention to provide a Dielectric Resonator which is simple and inexpensive to fabricate and which may be tuned within the oscillator circuit on a semi-automated basis by use of a laser trimmer.

It is yet a further object of the present invention to provide a Dielectric Resonator whose overall height is less than a screw-tuned resonator to permit closer spacing of modularized oscillator circuit assemblies.

These objects are preferably accomplished in a DRSO having a resonant frequency which may be varied by means of the variation of a thin, electrically-conductive layer of material on the surface of the resonator to open or close a variable window or iris into the cavity of the resonator.

DESCRIPTION OF THE DRAWINGS

These and other objects and advantages will become evident to those skilled in the art from a consideration of the following specification in conjunction with the drawings, wherein.

DESCRIPTION OF THE PREFERRED EMBODIMENTS

Figure 1:
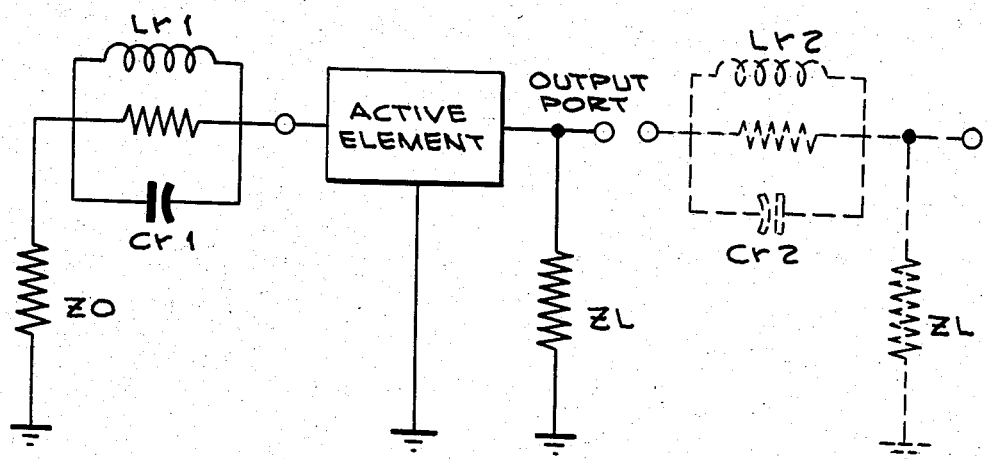
FIG. 1 is a diagram of a negative resistance type oscillator.

FIG. 1 illustrates a model for an oscillator circuit and incorporates an unstable, active circuit having properly chosen dielectric resonator "loads" which generate oscillations.

Figure 2:
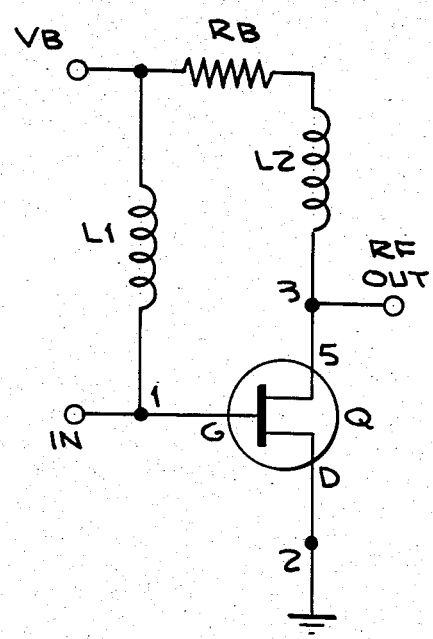
FIG. 2. is a schematic representation of the active portion of a typical oscillator circuit incorporating a GaAs FET, Q connected in a "common drain" configuration.

At microwave frequencies, active circuits incorporating GaAs FET's are known in the art, the use of these devices being predicated upon their high-speed switching characteristics and inherent instability. A typical circuit incorporating a GaAs FET as an active element is illustrated in FIG. 2 in which the FET Q is shown connected in the so-called "common drain" configuration. A biasing resistor RB and isolating coils L1 and L2 are shown across the gate and source of the FET to self-bias the transistor Q with biasing voltage VB. The input to the three-port device is at node 1 or the gate of the FET Q. The drain is connected at junction 2 directly to ground.

Figure 3:
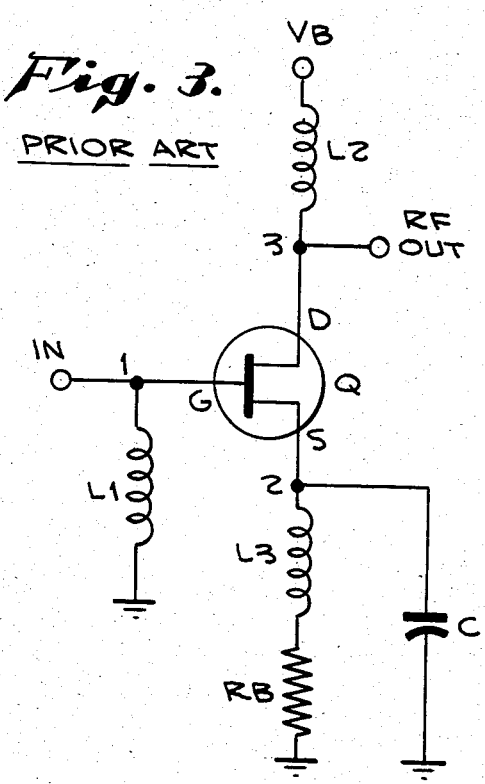
FIG. 3 is a schematic diagram of the active portion of an oscillator circuit incorporating a GaAs FET in a "common source" configuration.
Figure 4:
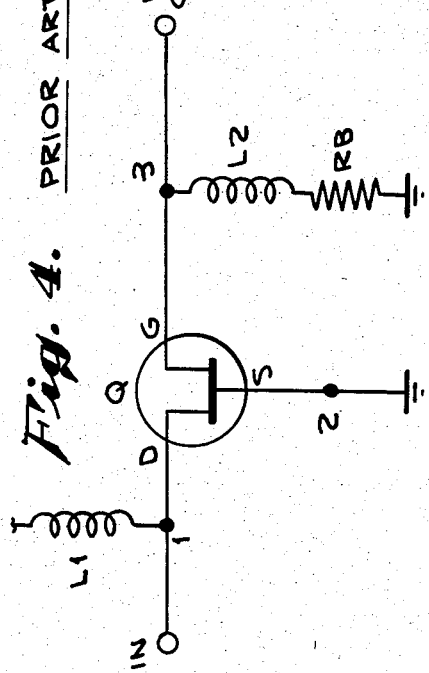
FIG. 4 is schematic diagram of the active portion of an oscillator circuit incorporating a GaAs FET connected in the "common gate" configuration.

Similarly, FIGS. 3 and 4 illustrate active circuits incorporating FET's connected in the common source and common gate modes, respectively. It is shown in the art that these circuits can be made to oscillate when suitably-fast types of devices are provided with appropriate values of biasing resistors RB and isolating reactances L1, L2, L3 and C, respectively, as well as the provision of suitable terminal loads.

Since oscillators are most often employed as reference devices, there is a strong need for devices which are stable in time with respect to frequency. This is no less true for devices operating in the microwave region. Yet, active circuits, even those which will oscillate reliably, are shown to drift in frequency with time to a degree that is unacceptable, due primarily to time-varying parameters within the circuit, including the gain, resistance, and reactance of the components themselves, as well as extrinsic sources such as spurious signals and stray capacitances, etc. Accordingly, it is known in the art to incorporate a device in the feedback loop of the oscillator which resonates at the desired frequency and which, if suitably configured to have a very large Q, will result in an oscillator whose frequency stability is dependent only upon the parameters of the resonator. Moreover, a high-Q resonator serves to drive the frequency of the oscillator strongly in the direction necessary to achieve zero phase shift in the tuned circuit, i.e., to restore the drifting frequency of the device to the desired, nominal frequency.

Figure 5:
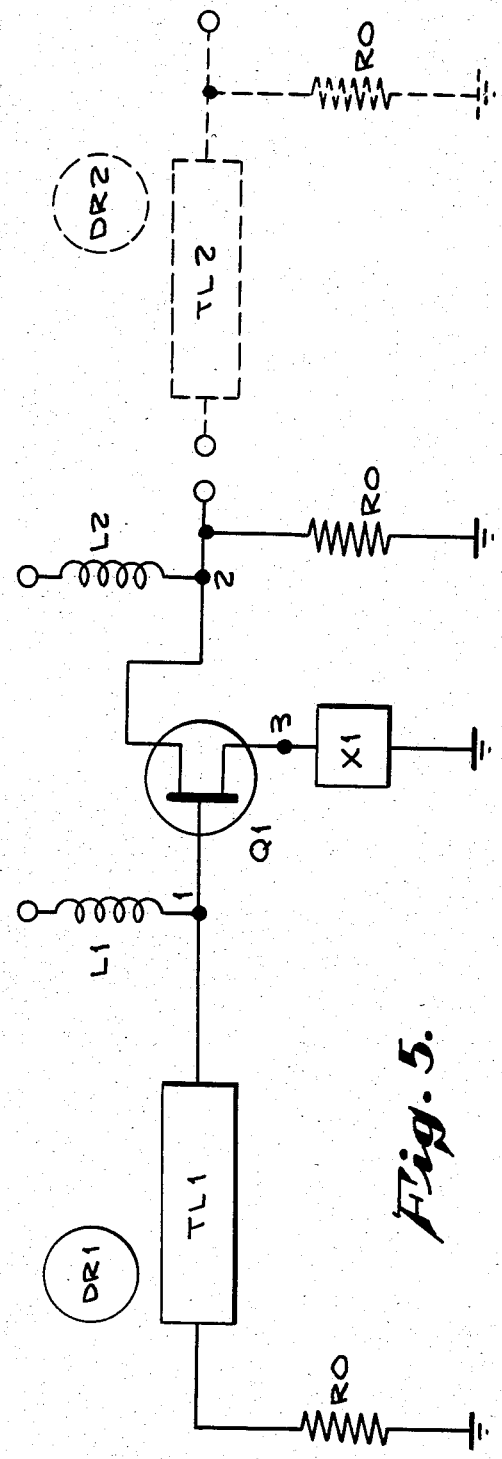
FIG. 5 is a schematic representation of the dielectric-resonator-stabilized oscillator (DRSO) that is the subject of the present invention, incorporating a Dielectric Resonator (DR) tuned resonant circuit interconnected to the active portion of the oscillator circuit by means of a transmission line, TL1, with an optional, DR-tuned, stabilized transmission line on the output leg of the oscillator shown in dotted lines.

At microwave frequencies, this can be achieved by the incorporation into the circuit of the elements illustrated in FIG. 5. FIG. 5 shows a 3-port oscillator representative of one of the FET configurations illustrated in FIGS. 2-4. Nodes 1-3 correspond to those illustrated in the preceding figures. Exemplary of the GaAs FET's which have been incorporated successfully within the present invention are Microwave Semiconductor Corporation part number MSC88101, Fujitsu Corporation part number FSX-52 and NEC part number NE869. On the input side of the oscillator, a dielectric resonator DR1 is shown coupled to an interconnecting transmission line TL1 which is terminated in its characteristic impedance, Ro. The "load" presented by the input resonator circuit will cause oscillations (negative resistance) at the output port terminal. A second, optional dielectric resonator DR2, with its accompanying interconnecting transmission line TL2 is shown on the output leg of the oscillator in dotted lines. This second resonator "load" can be attached to the output port terminal to optimize the output power and/or frequency stability of the oscillator. A pure reactance X1 is shown for illustration purposes connecting the third port of the oscillator to ground and, for certain configurations, will be seen to have a desired value of zero.

In the preferred embodiment, the entire circuit is implemented upon a substrate, e.g., an alumina substrate having a dielectric constant that is closely controlled. The GaAs FET Q, as well as the discrete resistance and reactances, can be implemented in either chip form or packaged form, depending on the configuration desired. Typically, RB will take on values on the order of 60 ohms, the inductances will have values on the order of 30 nanohenrys and capacitances will typically have values ranging from 10–100 pf. In the preferred embodiment of the invention, L1 is implemented in the form of a slab-type microstripline circuit etched on a fused silica or alumina substrate with a suitable ground plane provided below. TL1 is terminated in its characteristic impedance Ro, typically 50 ohms. But for the presence of the dielectric resonator DR1, the transmission line can sustain no standing wave, will have a VSWR of 1:1 and no signal will be reflected back to the oscillator. However, when DR1 is placed in close proximity to TL1 such that the signal from the oscillator is coupled into the resonator DR1, then TL1 takes on the characteristics of a lossless transmission line which is terminated in an open-circuit. The incident and reflected voltages are in phase at the resonator and at one-half wavelength intervals fro by the resonator, the VSWR is infinite and the magnitude of the Reflection Coefficient is 1.0. Thus, the circuit can be tuned initially to achieve the appropriate phase-relationship between the resonator and the oscillator by adjustment of the position of the resonator along the length of the transmission line.

Figure 6:
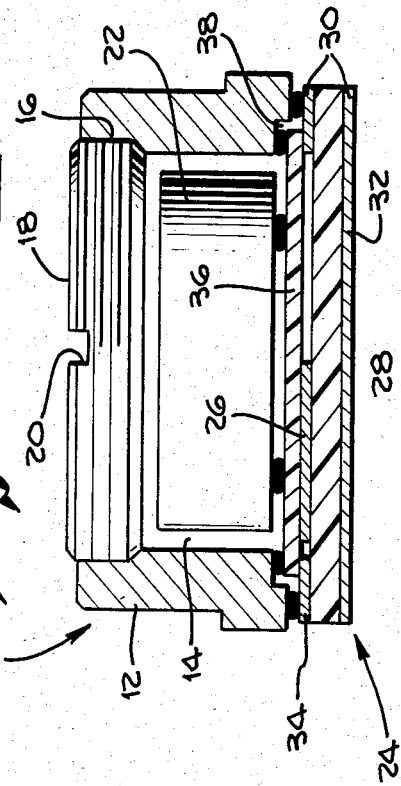
FIG. 6 illustrates a prior art DR cavity in cross section showing the operation of the tuning screw.

A dielectric resonator 10 of conventional form is illustrated in cross section in FIG. 6. The resonator 10 comprises an electrically-conductive housing 12 with a resonant cavity 14 therethrough. The housing 12 is threaded with threads 16 for some portion of the length of cavity 14 to permit the engagement with a conductive, threaded tuning screw 18. The tuning screw 18 may be turned by use of a screwdriver inserted into slot 20, causing the tuning screw 18 to rotate in and out of the cavity 14, which changes the resonant frequency of the resonator 10.

Enclosed within the housing 12 is a dielectric resonator body 22 which, in the preferred embodiment of the present invention is cylindrical in shape and monolithic in structure. Depending upon the desired properties of the resonator 10, the resonator body 22 may be selected from a wide variety of dielectric materials, but in the preferred embodiment, is fabricated from a dense, ceramic material having a dielectric constant of 30–40, typically, and one whose dielectric properties are highly stable with temperature and time, e.g., barium tetratitanate or zirconium-tin titanate. Other suitable dielectric materials include air, fused silica, fused quartz, silicon dioxide, aluminum dioxide, and titanium dioxide.

FIG. 6 further illustrates the conventional DR 10 mounted upon its associated transmission line 24 to couple the TEM-propogated RF signal from the oscillator into the cavity 14 by the close-coupling of the openended cavity 14 with the transmission line 24. In the preferred embodiment, the transmission line 24 is in the form of conventional slab-type microstrip having a conductor 26 etched onto a dielectric substrate 28, e.g. alumina, from the metalized surfaces 30 plated on both sides of the substrate 28. This etching process both defines the microstripline conductor 26 and leaves a ground plane 32 on the opposite side of the substrate 28 in the conventional manner. Additionally, vestigial ground planes 34 are left unetched on either side of the conductor 26 to provide further isolation and grounding at the inner face of the resonator housing 12.

The resonator body 22 is held rigidly in place within the cavity 14 of the housing 12 by means of bonding to a thin, dielectric support plate 36 which, in turn, is bonded into a recessed shoulder 38 in the housing 12. The support plate 36 is typically fabricated from a thin sheet of rigid, dielectric material, and in the preferred embodiment, is made from fused silica.

In the exemplary embodiment, the DR assembly 10 is bonded directly in place on the residual ground planes 34 oon either side of the microstrip 24 such that the outside edge of the conductor 26 is aligned tangentially through the support plate 36 with the outside edge of resonator body 22.

In practice, DR 10 is initially located at a measured position, along the length of transmission line 24 derived by calculation. The oscillator is then switched on to verify that it is oscillating at the desired frequency. The oscillator then is finely tuned while operating by use of the screwdriver slot 20 as described above to achieve the final desired frequency at the output. The tuning screw 18 is then locked into position, as by a set screw (not shown), taking care to avoid any slight movement which would tend to de-tune the oscillator. This may also be accomplished by "staking" the tuning screw 18 to the resonator housing 12 by means of the deposition of a small quantity of bonding material, e.g. epoxy, at the interface of the tuning screw 18 and the housing 12.

A similar procedure is adopted if a second, optional dielectric resonator DR2 (as illustrated by dotted lines in FIG. 5) is incorporated within the circuit of the output leg of the oscillator. With appropriate selection of materials for the housing 12, body 22, and transmission line 24, a resonant-tuned circuit can be achieved in the frequency region of 1 GHz –20 GHz of approximately 5 ppm/° C. using one resonator DR1 on the input leg of the oscillator circuit, and a stability of 1 ppm/° C. may be achieved by incorporating a second resonator on the output leg.

Those skilled in the art will recognize that, although materials can be selected for the resonator which are not strongly temperature dependent, it is presently impossible to specify materials that are completely independent of temperature. Hence, the stability figures referenced above are stated in terms of their temperature dependence. Thus, if additional stability with temperature is necessary, some form of temperature compensation or overall temperature stabilization of the device will be necessary.

Figure 7:
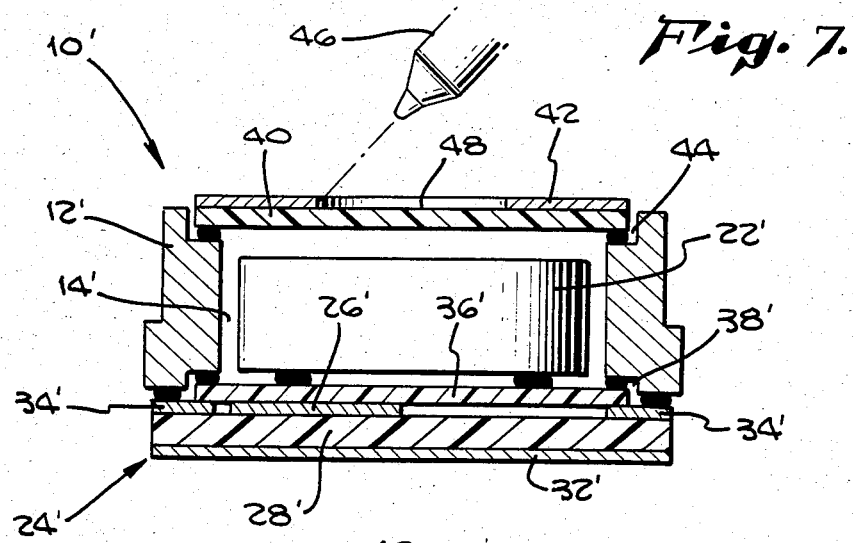
FIG. 7 is a cross section through the DR of the present invention showing a laser burning away the metalized upper surface of the DR to accomplish fine tuning of the oscillator circuit.
Figure 8:
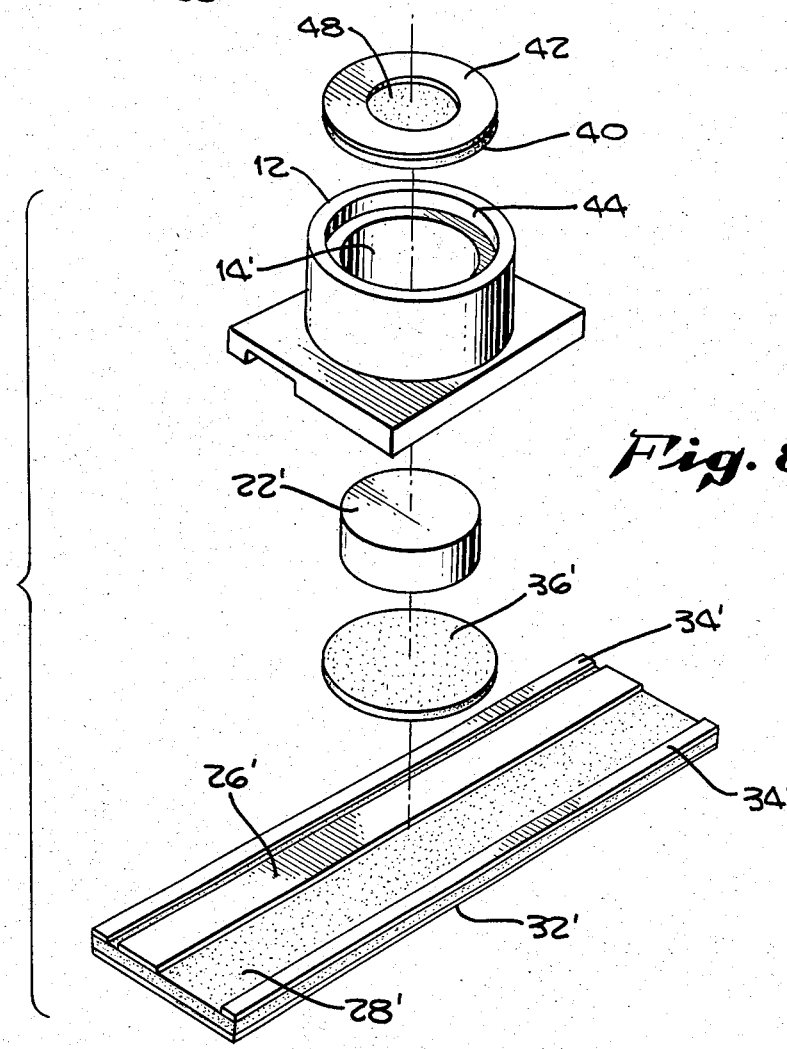
FIG. 8 is an exploded view of the improved DR illustrated in FIG. 8 shown in conjunction with the associated microwave transmission line.

In a preferred embodiment of the present invention, an improved dielectric resonator 10' is illustrated in cross section in FIG. 7. As before, resonator assembly 10' mounts directly on the transmission line 24' and is bonded in place by special heat-cured or UV-cured epoxy to the vestigial ground planes 34'. A resonator housing 12' having a resonating cavity 14' encloses a dielectric resonator body 22' which is held in place within the housing 12' by a support plate 36' of fused silica which is bonded into a stepped shoulder 38' within the housing 12'. However, the improved resonator 10' differs from the conventional resonator 10 by the provision of a dielectric tuning plate 40 having a metalized surface 42. Tuning plate 40 is bonded rigidly in place at the top of the housing 12' in a counterbored shoulder 44 to serve as a closure for the cavity 14'. In the preferred embodiment, the metalized surface 42 consists of a thin layer of chrome-gold alloy which is plated onto the tuning plate 40, typically made of alumina. Alternatively, other materials may be utilized, such as gold, silver, platinum, copper, tin, lead, chromium, cadmium, nickel, nickel-cadmium alloy, or tin-lead alloy, as the metalized surface 42. The implementation of FIG. 7 with the tuning plate 40 mounted in the resonator 10' eliminates the threaded tuning screw 18 of the conventional form FIG. 6, and the attendant mechanical adjustment problems. Yet, the resonant frequency of the DR 10' may still be tuned with a degree of fineness equal to, or greater than, that of the conventional resonator 10 by the selective removal of an area 48 of the metalization 42 on the dielectric tuning plate 40. By this selective removal of an area 48 of metalization 42, the overall dielectric properties of the DR 10' are altered slightly, which, in turn, alters the resonant frequency of the DR 10'. In the preferred embodiment, the DR 10' is tuned by the removal of metalization by burning it away with a programmed laser 46. This serves to reduce the resonant frequency of the DR. Thus, it is intended that the initial resonant frequency of the overall circuit will be at a frequency above the final desired frequency. The resonator 10' may be then positioned below the output of the laser 46, which may be set up on a semi-automated basis to burn away the metalization 42 at a prescribed rate and in a predetermined pattern until the final desired frequency is obtained.

While fine tuning is accomplished by the laser removal of the metalization 42, coarse tuning is accomplished by moving the housing 10' along the transmission line 24' to the desired location. The desired frequency may then be finely tuned by laser removal of metal layer 42. Thereafter, housing 10' may be fixed permanently upon the strip line 24' by exposing the special epoxy material to heat or UV light.

Tests have demonstrated that the resonant frequency of the DR 10' can be adjusted upward, should that be necessary, by the addition of metalization 42 to a tuning plate 40 which previously has had the metalization 42 removed. This is accomplished by coating the unmetalized area with an epoxy material containing metalization particles. However, it is not anticipated that this method of fine-tuning the oscillator will be implemented in production, and is recommended only as a means for re-tuning of the circuit to a higher final frequency when the oscillator has previously been tuned to a lower frequency by means of the above-described method of tuning.

By incorporation of a resonator 10' in accord with the present invention, the tuning screw 18, with its concommitant precision-machined screw threads 16, is eliminated, as is any need for a set screw or a "staking" of the tuning feature, once the desired frequency is obtained. Also, the tuning procedure involving the burning away of the metalization layer 42 may be done at a very gradual rate of reduction of area, such that extremely fine tuning of the oscillator is obtained, with no backlash problems which occur with the conventional movement of the tuning screw 18. Since the tuning plate 40 is bonded rigidly to the housing 12', problems relating to movement of the tuning screw 18 due to vibration are eliminated. Finally, since the tuning plate 40 is not required to move vertically within the adjustment tolerance of the resonator 10', the overall height of the resonator 10' may be reduced by approximately 0.1–0.2 inch below that of the conventional embodiment 10. This results in a space-saving reduction in height of the overall oscillator which will be appreciated by those obligated to implement the oscillator within a stacked, modularized form, e.g., an airborne radar system.

The particular materials and configuration of the preferred embodiment are disclosed for illustrative purposes only, and alternative embodiments, materials and components will readily suggest themselves to those skilled in the art which will achieve equivalent or substantially similar results, depending upon the requirements of the particular application.

Accordingly, the scope of my invention as disclosed herein, a dielectric-resonator-stabilized oscillator having an improved dielectric resonator that is fine-tunable by means of laser-etching process, should be limited only by the following claims.

I claim:

1. A tunable, frequency-stabilized oscillator, comprising:

a negative resistance oscillator circuit having at least one active element; and at least one dielectric resonator connected in said oscillator circuit having at least one electrically-conductive area on its surface, the selective variation in size of which alters the resonant frequency of said at least one resonator;

said at least one dielectric resonator further comprising:
  a. an electrically conductive resonator housing having a resonating cavity therethrough;
  b. a resonator body made of dielectric medium;
  c. a resonator body mounting plate of thin, rigid dielectric material mounted at one end of said cavity in said housing to mount said resonator body within said cavity; and
  d. a tuning plate of thin, rigid dielectric material mounted at the other end of said cavity from said first-mentioned plate, coated with an electrically conductive material whose areal extent over said plate may be selectively varied, whereby the resonant frequency of said dielectric resonator may be finely tuned.

2. The device as recited in claim 1 wherein said active element of said oscillator circuit is at least one transistor.

3. The device as recited in claim 2 wherein said transistor is a Field Effect Transistor (FET).

4. The device as recited in claim 3 wherein said FET is a Gallium Arsenide (GaAs) FET.

5. The device as recited in claim 1 wherein said at least one resonator is connected to said oscillator circuit by a transmission line.

6. The device as recited in claim 5 wherein said transmission line is a slab-type microstrip.

7. The device as recited in claim 1 wherein said electrically-conductive surface said area of which is selectively varied for tuning said circuit is a metal.

8. The device as recited in claim 7 wherein said metal is selected from the group consisting of gold, silver, platinum, copper, tin, lead, chromium, cadmium, nickel, nickel-cadmium alloy, tin-lead alloy or chrome-gold alloy.

9. The device as recited in claim 1 wherein said cavity has an aperture therein through which electromagnetic energy may be coupled into said cavity and at least one other aperture the area of which may be selectively varied while said resonator is in place within said circuit to vary the resonant frequency of said cavity and said circuit.

10. The device as recited in claim 1 wherein said dielectric resonator body is selected from the group consisting of air, fused silica, fused quartz, silicon dioxide, aluminum dioxide, titanium dioxide, barium tetratitanate, or zirconium-tin titanate.

11. A method for fine-tuning a stabilized oscillator of the type described in claim 1, comprising the steps of:
  a. Stabilizing the components of said oscillator at some reference temperature;
  b. Adjusting the electrical position of said at least one resonator within said oscillator circuit to a position which achieves sustained oscillation at an output frequency within 50 ppm of a desired frequency at said reference temperature;
  c. Fixing said position of said at least one resonator within said oscillator circuit;

d. Comparing said output frequency of said oscillator to said desired output frequency at said referenced temperature; and e. Varying selectively said area of said electrically conductive material in said at least one resonator until said output frequency of said stabilized oscillator is within 1–5 ppm of said desired output frequency at said reference temperature.

12. The method as recited in claim 11 wherein said step of selectively varying said area of said electrically conductive material further comprises burning said material away with a laser.

13. A dielectric resonator for use in combination with a frequency-stabilized oscillator of the type which includes an RF oscillator circuit having at least one gallium arsenide field effect transistor as an active element, said dielectric resonator being tuned to a frequency within the resonant frequency region of said oscillator circuit, and a slab-type microstripline transmission line to interconnect said resonator to said oscillator;

said dielectric resonator having at least one electrically conductive area on its surface the selective variation in size of which alters the resonant frequency of said resonator;

said dielectric resonator further comprising:

a. an electrically conductive resonator housing having a resonating cavity therethrough;

b. a resonator body made of dielectric medium;

c. a resonator body mounting plate of thin, rigid dielectric material mounted at one end of said cavity in said housing to mount said resonator body within said cavity; and d. a tuning plate of thin, rigid dielectric material fixedly-mounted to said housing at the other end of said cavity from said first-mentioned plate, coated with an electrically conductive material, whose areal extent over the plate may be selectively varied, whereby the resonant frequency of said dielectric resonator may be finely tuned.

14. The device as recited in claim 13 wherein said electrically conductive material is a metal.

15. The device as recited in claim 14 wherein said metal is selected from the group consisting of gold, silver, platinum, copper, tin, lead, nickel, chromium, cadmium, chrome-nickel alloy, tin-lead alloy or chrome-gold alloy.

16. The device as recited in claim 13 wherein said cavity has an aperture therein through which electromagnetic energy may be coupled into said cavity, and at least one other aperture the area of which may be selectively varied while said resonator is in place within said circuit to vary the resonant frequency of said cavity and said circuit.

17. The device as recited in claim 13 wherein said dielectric resonator body is selected from the group consisting of air, fused silica, fused quartz, silicon dioxide, aluminum dioxide, titanium dioxide, barium tetratitanate, or zirconium-tin titanate.

* * * * *